United States Patent
Kim

(10) Patent No.: US 6,903,604 B2
(45) Date of Patent: Jun. 7, 2005

(54) METHOD AND APPARATUS FOR MODELING AND ESTIMATING THE CHARACTERISTICS OF A POWER AMPLIFIER

(75) Inventor: Jaehyeong Kim, Pine Brook, NJ (US)

(73) Assignee: Lucent Technologies Inc., Murray Hill, NJ (US)

(*) Notice: Subject to any disclaimer, the term of this patent is extended or adjusted under 35 U.S.C. 154(b) by 905 days.

(21) Appl. No.: 09/876,772

(22) Filed: Jun. 7, 2001

(65) Prior Publication Data

US 2002/0193087 A1 Dec. 19, 2002

(51) Int. Cl.[7] ............ G01R 19/00; H03F 1/26; H04K 1/02

(52) U.S. Cl. ............ 330/2; 330/149; 330/297; 455/63; 375/296; 375/297

(58) Field of Search ............ 330/2, 149, 297; 455/63; 375/296, 297; 326/560

(56) References Cited

U.S. PATENT DOCUMENTS

| | | | | |
|---|---|---|---|---|
| 6,118,335 A | * | 9/2000 | Nielsen et al. | 330/2 |
| 6,141,390 A | * | 10/2000 | Cova | 375/297 |
| 6,236,837 B1 | * | 5/2001 | Midya | 455/63.1 |
| 6,462,617 B1 | * | 10/2002 | Kim | 330/2 |
| 6,496,062 B1 | * | 12/2002 | Nitz et al. | 330/52 |
| 6,504,425 B1 | * | 1/2003 | Kim | 330/2 |

* cited by examiner

*Primary Examiner*—Michael B. Shingleton

(57) ABSTRACT

Disclosed is an apparatus and method for modeling and estimating the characteristics of a power amplifier with memory. A predistortion module generates a predistorted signal in response to coefficients of a complex polynomial representative of the amplifier and to an input signal. A power amplifier receives time-spaced samples of the predistorted signal and generates an output signal. A polynomial module updates the coefficients of the complex polynomial in response to a current sample of the output signal and to the time-spaced samples of the predistorted signal. In particular, the complex polynomial is implemented with both even and odd terms.

18 Claims, 2 Drawing Sheets

METHOD AND APPARATUS FOR MODELING AND ESTIMATING THE CHARACTERISTICS OF A POWER AMPLIFIER

RELATED APPLICATIONS

The present patent application is related to U.S. patent application Ser. No. 09/876,696, entitled, "METHOD AND APPARATUS FOR MODELING AND ESTIMATING THE CHARACTERISTICS OF A POWER AMPLIFIER BY RETAINING EVEN-ORDER TERMS IN ESTIMATING CHARACTERISTICS", being concurrently filed herewith and having a filing date of Jun. 7, 2001, to U.S. patent application Ser. No. 09/878,037, entitled, "METHOD AND APPARATUS FOR CALCULATING THE PREDISTORTION FUNCTION FROM A POWER AMPLIFIER", being concurrently filed herewith and having a filing date of Jun. 8, 2001,; and to U.S. patent application Ser. No. 09/878,038, entitled, "METHOD AND APPARATUS FOR CALCULATING THE PREDISTORTION FUNCTION FROM A POWER AMPLIFIER", being concurrently filed herewith and having a filing date of Jun. 8, 2001,; all of which have a common inventor and assignee and being incorporated herein by reference.

FIELD OF THE INVENTION

This invention relates generally to signal amplification and, in particular, to estimating signal amplifier characteristics for intentionally induced distortion techniques utilized prior to and in conjunction with signal amplification.

BACKGROUND OF THE INVENTION

In the field of radio communication systems, it is a well-known problem that the power amplifiers present in transmission equipment operate in a non-linear fashion when the power amplifiers are operated near their peak output. As a result, the power amplifier introduces significant signal distortion that can appear in various forms. For example, if more than one signal is input into the power amplifier or power amplification stage, its non-linear characteristics can cause an undesirable multiplicative interaction of the signals being amplified, and the power amplifier's output can contain intermodulation products. These intermodulation products cause interference and crosstalk over the power amplifier's operational frequency range.

In power amplifier design, there is a trade off between distortion performance and efficiency. Linear amplifiers that operate under "Class A" conditions create little distortion but are inefficient, whereas nonlinear amplifiers operated under "Class C" conditions are reasonably efficient but introduce significant distortions. While both efficiency and distortion are important considerations in amplifier design, efficiency becomes increasingly important at high power levels. Because of their efficiency, nonlinear amplifiers are largely preferred, leaving the user with the problem of distortion.

In order to employ nonlinear power amplifiers, techniques have been used to improve linearity and thereby reduce the effects of interference and crosstalk. Linearity can be achieved by application of various linearization techniques that reduce the distortion caused by nonlinear amplification. Conventional amplifier linearization techniques can be broadly categorized as feedback, feedforward, or predistortion.

The last mentioned technique, predistortion, intentionally distorts the signal before the power amplifier so that the non-linearity of the power amplifier can be compensated. According to this technique, linearization is achieved by distorting an input signal according to a predistortion function in a manner that is inverse to the amplifier characteristic function. The predistortion technique can be applied at radio frequency (RF), intermediate frequency (IF), or at baseband.

In the baseband domain, the input signal information is at a much lower frequency, allowing digital methods to be employed. The predistortion function is applied to the input signal with the resulting predistorted signal being upconverted to IF and then finally to the RF carrier frequency. It is also possible to apply adaptive predistortion techniques where feedback from the output of the amplifier is used to update and correct the predistortion function.

The form of the predistortion function is dependent upon the model used to characterize the output of the amplifier. Predistortion functions in the baseband domain are typically implemented as a table of gain and phase weighting values within a digital signal processor. A Cartesian feedback method employs a quadrature representation of the signal being amplified. The incoming quadrature signals I and Q are compared to the feedback quadrature signals. Thus, there are two sets of coefficients, one for each quadrature channel, that are being updated to model the predistortion characteristics. In this manner, gain and phase non-linearities within the amplifier can be compensated. Performance is dependent on the size of the look up table and the number of bits used to represent the signal. Better performance and more adaptivity is achieved with larger look up tables and more bits albeit at the expense of longer processing times.

Predistortion functions are also modeled as polynomials. Ideal amplifiers have linear characteristics; consequently, amplifiers with slight non-linearities can be modeled as polynomials of only a few terms, with only odd terms being employed. Even terms are discarded because their use with negative-valued inputs can interfere with linearity. While processing demands are eased by excluding and limiting the number of terms in the polynomial modeling, performance is sacrificed.

Adaptive methods generally process and model current amplifier characteristics. The current output signal of the amplifier is contrasted against the current input signal to the amplifier. Past inputs are not considered. However, amplifier characteristics are dependent upon frequency due to the speed in which input signals change amplitude as a function of frequency. Exclusion of past inputs precludes modeling those changes and limits the accuracy with which the amplifier can be modeled and thereby limits the bandwidth.

Accordingly, there is a need for a device to more quickly and efficiently determine the characteristics of a frequency dependent amplifier.

SUMMARY OF THE INVENTION

The present invention teaches an apparatus and method for modeling and estimating the characteristics of a power amplifier. A predistortion module generates a predistorted signal in response to an input signal and to coefficients of a complex polynomial representative of the amplifier. The power amplifier receives time-spaced samples of the predistorted signal and generates an output signal. A polynomial module characterizes the power amplifier and updates the coefficients of the complex polynomials in response to the time-spaced samples of the predistorted signal and to a current sample of the output signal. For example, the polynomial module characterizes the amplifier using a complex polynomial for each of a plurality of time-spaced samples, such as a current sample and at least one previous sample of the predistorted signal. In certain embodiments, the amplifier is characterized as a summation of the complex polynomials. Given the current sample of the output signal, the polynomial module updates the coefficients of the complex polynomials, which characterize the power amplifier.

In an exemplary embodiment of the present invention, the coefficients of the complex polynomial are generated for each of a plurality of delay taps.

In another exemplary embodiment of the present device, the polynomial module employs a minimum mean squared error criteria to determine said polynomial coefficients, thereby allowing a very fast and efficient implementation.

By including time-spaced samples in the calculation of the polynomial coefficients, the present invention is able to accommodate the memory effect of the power amplifier and thereby model the non-linear and frequency dependent aspects of the power amplifier. Because wide band signals are particularly sensitive to frequency responses, the present invention improves the ability to operate at wider bandwidths without significant degradation in performance. By improving the ability to model power amplifiers, the present invention improves the ability to obtain the power amplifier predistortion function. The invention further enables power amplifiers to be operated in the nonlinear region near saturation, yet suppresses undesirable intermodulation products. Resort to a larger amplifier, to keep operation within the linear region, is avoided. Advantageously, keeping power amplifier sizes small results in cost savings, particularly important in the field of wireless communications.

The above factors make the present invention essential for effective power amplifier predistortion.

BRIEF DESCRIPTION OF THE DRAWINGS

For a better understanding of the present invention, reference may be had to the following description of exemplary embodiments thereof, considered in conjunction with the accompanying drawings, in which.

DETAILED DESCRIPTION

The following description is presented to enable a person skilled in the art to make and use the invention, and is provided in the context of a particular application and its requirements. Various modifications to the disclosed embodiments will be readily apparent to those skilled in the art, and the general principles defined herein may be applied to other embodiments and applications without departing from the spirit and the scope of the invention. Thus, the present invention is not intended to be limited to the embodiments disclosed, but is to be accorded the widest scope consistent with the principles and features disclosed herein.

The specification initially discusses the general concept and principles of adaptive digital predistortion in view of the novel system for determining the characteristics of a power amplifier. Exemplary embodiments of the system for determining the characteristics of a power amplifier are then described.

Overview of Adaptive Power Amplifier Predistortion

Figure 1:
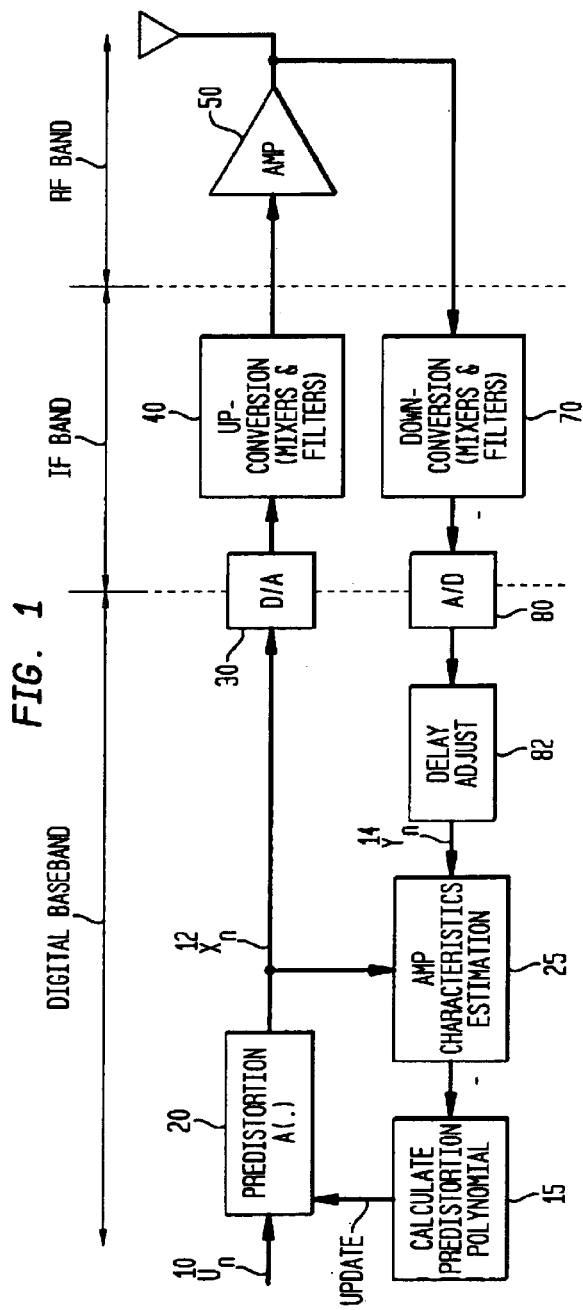
FIG. 1 is a block diagram providing an overview of an exemplary system employing adaptive power amplifier predistortion.

The principal benefit of the present invention is the ability to more efficiently model the power amplifier characteristics in order to improve the ability to employ adaptive digital predistortion (ADPD). The structure of an exemplary ADPD system is seen in FIG. 1. An initial baseband digital signal 10 is identified as $u_n$, where n is the time index. The initial baseband digital signal 10 is fed into a predistortion system 20 that is described as a function $A(\cdot)$. The output of the predistortion system 20 is the baseband digital input signal 12 to the power amplifier 50 and is defined as $x_n$. The baseband digital input signal 12 is processed by a digital to analog (D/A) converter 30 with the resulting baseband analog signal being processed by an up-conversion means 40 that is comprised of mixers and filters and operates in the intermediate frequency (IF) range. The up-conversion means 40 outputs a signal in the radio frequency (RF) range and feeds the signal to the power amplifier 50. While there are many methods for ADPD, the approach with the exemplary invention can be divided into two steps. First, the characteristics of the power amplifier 50 are estimated. Then, the predistortion function based on the power amplifier's 50 characteristics is obtained. For proper characterization of the power amplifier 50, the time domain inputs and outputs of the power amplifier 50 need to be compared. Thus, the output of the power amplifier 50 is tapped and fed back to a down-conversion means 70. Like the up-conversion means 40, the down-conversion means 70 requires mixers and filters in the IF range. The output of the down-conversion means 70 is fed into an analog to digital (A/D) converter 80. The output of the A/D converter 80 is input into a means for delay adjustment 82 with its output representing the baseband digital output signal 14 identified as $y_n$. The baseband digital output signal 14 and the baseband digital input signal 12 are input to the polynomial module 25 in order to determine the coefficients that characterize the power amplifier 50. The output of the polynomial module 25 is coupled to the predistortion polynomial module 15 that determines the predistortion coefficients that are fed into the predistortion module 20. The polynomial module, predistortion polynomial module and predistortion module may be implemented in hardware, or in other forms such as software or firmware.

As implemented in FIG. 1, the baseband digital input signal 12 to the power amplifier 50 as well as the baseband digital output signal 14 of the power amplifier 50 are easily accessible. However, the up-conversion means 40 and the down-conversion means 70 distort the signals. Mixers are nonlinear devices and will add non-linear distortions. Furthermore, the phase responses of analog filters are not linear, thereby causing different time delays for different frequency components. Generally, these distortions can be considered negligible or can be corrected by using linear filters, and considered to be part of the baseband model for the power amplifier.

Figure 2:
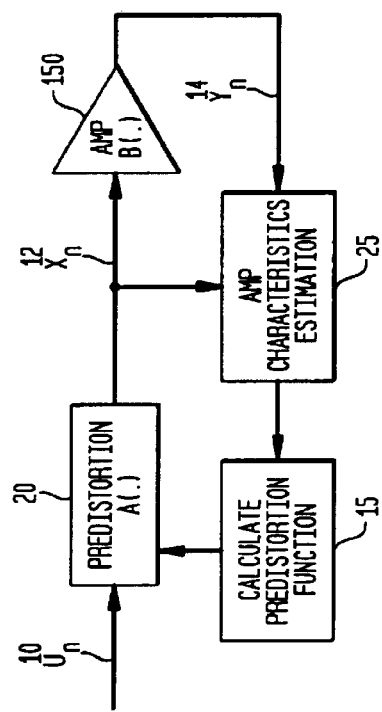
FIG. 2 is a block diagram of the simplified baseband model for power amplifier predistortion.

By neglecting the effect of up-conversion and down-conversion process, the whole predistortion process can be considered in the baseband domain. In FIG. 2, an exemplary baseband model for predistortion processing is illustrated. The power amplifier 150 is defined as a baseband function $B(.)$ with complex inputs and complex outputs.

Polynomial Modeling of a Power Amplifier

Predistortion requires the information on the characteristics of the power amplifier 150. Power amplifiers 150 are frequency dependent and have memory in the sense that the output of the power amplifier 150 is not only a function of the current input but also a function of past inputs. Thus, to properly model a power amplifier, memory impacts as well as non-linear responses must be accommodated. Let $x_n$ be the input sample and $y_n$ be the corresponding output sample, where $n \in \{1, 2, \ldots, N\}$ is the time index. M is the order of the power amplifier memory. Thus, M is equal to the number of delay terms used to model past inputs. The delay terms can be realized with delay taps to insure that the past inputs are properly synchronized. The relations are modeled as $$y_n = \sum_{m=0}^{M-1} B_m(\vec{b_m}, x_{n-m}) \quad (1)$$

Where $$B_m(\vec{b_m}, x_{n-m}) = b_{m1} x_{n-m} + b_{m2} |x_{n-m}| x_{n-m} + b_{m3} |x_{n-m}|^2 x_{n-m} + \ldots + b_{mp_m} |x_{n-m}|^{P_m-1} x_{n-m} \quad (2)$$

where $P_m$ is the order of the polynomial $B_m(\vec{b_m}, x_{n-m})$, and the components of vector $\vec{b}_m \{b_{m1}, b_{m2}, b_{m3}, \ldots, b_{mp_m}\}$ are complex numbers. The optimum $\vec{b}_m$ can be estimated by using the Newton Method.

Estimation of the Characteristics of a Power Amplifier

An estimation is performed in order to obtain an optimum $\vec{b}_m$, where $m \in \{0, 1, 2, \ldots, M-1\}$ that describes the characteristics of the power amplifier 150. Using the minimum mean squared error (MMSE) criteria based on the complex input and output samples of power amplifier and defining the complex coefficient vector $\vec{b}$ as $\vec{b} = [\vec{b_0}, \vec{b_1}, \vec{b_2}, \ldots, \vec{b_{M-1}}]$, the error function $f(\vec{b})$ can be defined as $$f(\vec{b}) \equiv E\left[\left\|y_n - \sum_{m=0}^{M-1} B_m(\vec{b_m}, x_{n-m})\right\|\right] \quad (3)$$

E[x] is the mean of x. The estimation procedure can be formulated as $$\vec{b} = \arg\min f(\vec{b}) \quad (4)$$

where argmin $f(.)$ means the arguments of the function $f(.)$ that makes $f(.)$ minimum. From equations (1), (2) and (3), it is known that $f(\vec{b})$ is a quadratic function of $\vec{b}$. If Hessian matrix H, the second partial derivative of $f(\vec{b})$, is a positive definite matrix, then $f(\vec{b})$ has a global minimum. Let $\vec{b}_0$ be an initial value, then according to the Newton Method, the optimum coefficient vector $\vec{b}_{opt}$ can be obtained as $$\vec{b}_{opt} = i\vec{b_0} - H^{-1} \cdot \nabla f(\vec{b_0}) \quad (5)$$

Where $\nabla f(\vec{b})$ is the gradient of $f(\vec{b})$.

Thus, in the present invention, the polynomial module 25 characterizes the power amplifier 150 and updates the coefficients of the complex polynomials in response to the time-spaced samples of the predistorted signal and to a current sample of the output signal. For example, the polynomial module 25 characterizes the power amplifier 150 using a complex polynomial for each of a plurality of time-spaced samples, such as a current sample and at least one previous sample of the predistorted signal. In certain embodiments, the power amplifier 150 is characterized as a summation of the complex polynomials. Given the current sample of the output signal, the polynomial module updates the coefficients of the complex polynomials, which in turn, characterizes the power amplifier 150.

Figure 3:
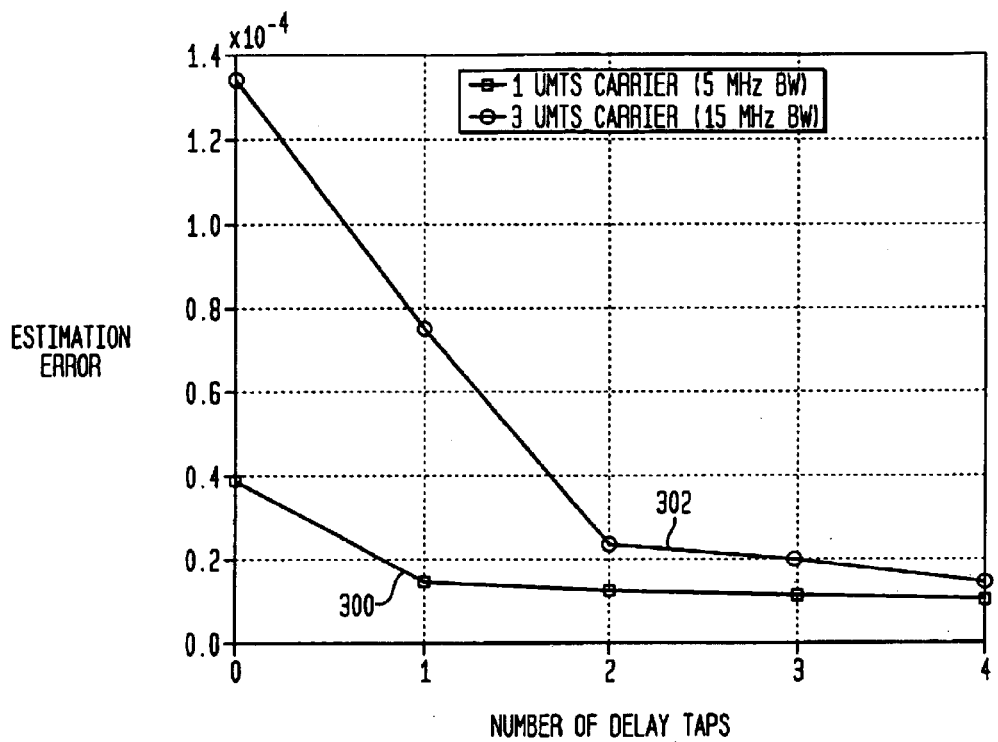
FIG. 3 shows the effect of adding delay terms or taps when modeling the power amplifier.

FIG. 3 shows the effect of adding delay terms or taps when modeling the power amplifier. In the case of a narrow band signal 300, adding more delay terms does not have much impact on the reduction of the estimation error. However, the estimation error for the wide band signal 302 can be significantly reduced by providing additional delay terms.

Figure 4:
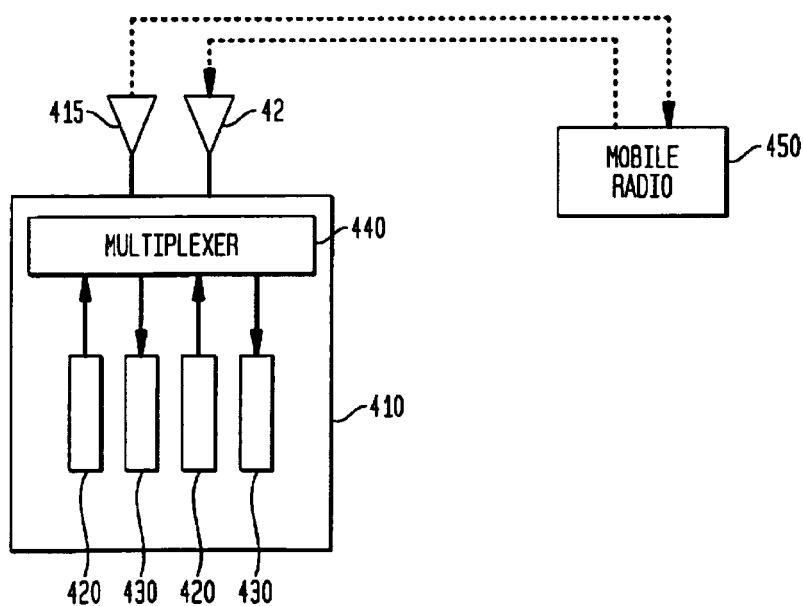
FIG. 4 is a block diagram illustrating the device of FIG. 2 as used in a RF transmission system in accordance with the principles of the present invention.

FIG. 4 illustrates a base station 410 with power amplifiers employing a predistortion linearization technique in accordance with the principles of the present invention.

As shown in FIG. 4, base station 410 comprises a pair of transmitters 420 each having a power amplifier as shown in FIG. 3. Base station 410 can comprise, if necessary, a single transmitter or additional transmitters. In addition, base station 410 includes a suitable transmit antenna 415 for transmission in a RF transmission system that comprises both wireless and wired equipment. Base station 410 can utilize any equipment suitable for sending and receiving RF transmissions, such as those employing Code Division Multiple Access (CDMA) communications. In FIG. 4, a mobile radio 450 is shown as well as the base station 410 including a receive antenna 425, pair of receivers 430 and a multiplexer 440. Additional mobile radios may be serviced by the base station 410, and it will be apparent to one of ordinary skill that base station 410 can be used for providing wireless communications in any desired manner and for any type of wireless communications protocol or standard.

Numerous modifications and alternative embodiments of the invention will be apparent to those skilled in the art in view of the foregoing description. Accordingly, this description is to be construed as illustrative only and is for the purpose of teaching those skilled in the art the best mode of carrying out the invention. Details of the structure may be varied substantially without departing from the spirit of the invention and the exclusive use of all modifications that come within the scope of the appended claim is reserved.

What is claimed:

1. An apparatus for modeling and estimating the characteristics of a power amplifier, said apparatus comprising:
   a predistortion module responsive to an input signal and coefficients of a complex polynomial representative of said amplifier by generating a predistorted signal;
   the amplifier responsive to a plurality of time-spaced samples of said predistorted signal by generating an output signal; and
   a polynomial module responsive to a current sample of said output signal and to a plurality of time-spaced samples of said predistorted signal by generating an update of said coefficients of a complex polynomial representative of said amplifier as feedback into said predistortion module.

2. The apparatus according to claim 1, wherein said coefficients are generated for each of a plurality of delay taps.

3. The apparatus according to claim 2, wherein said polynomial module is represented by the equation $$y_n = \sum_{m=0}^{M-1} B_m(\vec{b_m}, x_{n-m})$$

wherein "n" is a time index, wherein $x_n$ is a current sample of said predistorted signal, wherein $y_n$ is said current sample of said output signal, wherein $B_m(\cdot)$ is a polynomial representation of said amplifier, wherein $\vec{b}_m$ is a vector of said complex polynomial coefficients, and wherein M is an order of amplifier memory equal to the number of said plurality of delay taps.

4. The apparatus according to claim 3, wherein said complex polynomial includes both even and odd terms.

5. The apparatus according to claim 4, wherein said polynomial module employs a minimum mean squared error criteria to determine said polynomial coefficients.

6. A wireless radio frequency communications system including apparatus for modeling and estimating the characteristics of a power amplifier, said system comprising:

a predistortion module responsive to an input signal and coefficients of a complex polynomial representative of said amplifier by generating a predistorted signal;

the amplifier responsive to a plurality of time-spaced samples of said predistorted signal by generating an output signal; and a polynomial module responsive to a current sample of said output signal and to a plurality of time-spaced samples of said predistorted signal by generating an update of said coefficients of a complex polynomial representative of said amplifier as feedback into said predistortion module.

7. The system according to claim 6, wherein said coefficients are generated for each of a plurality of delay taps.

8. The system according to claim 7, wherein said polynomial module is represented by the equation $$y_n = \sum_{m=0}^{M-1} B_m(\vec{b_m}, x_{n-m})$$

wherein "n" is a time index, wherein $x_n$ is a current sample of said predistorted signal, wherein $y_n$ is said current sample of said output signal, wherein $B_m(\cdot)$ is a polynomial representation of said amplifier, wherein $\vec{b}_m$ is a vector of said complex polynomial coefficients, and wherein M is an order of amplifier memory equal to the number of said plurality of delay taps.

9. The system according to claim 8, wherein said complex polynomial includes both even and odd terms.

10. The system according to claim 9, wherein said polynomial module employs a minimum mean squared error criteria to determine said polynomial coefficients.

11. A method for modeling and estimating the characteristics of a power amplifier, comprising the steps of:

generating a predistorted signal in response to an input signal and to coefficients of a complex polynomial representative of said amplifier;

amplifying a plurality of time-spaced samples of said predistorted signal to generate an output signal; and generating an update of said coefficients of a complex polynomial representative of said amplifier in response to a current sample of said output signal and to said plurality of time-spaced samples of said predistorted signal.

12. The method according to claim 11, wherein said coefficients are generated for each of a plurality of delay taps.

13. The method according to claim 12, wherein said coefficients generating step is represented by the equation $$y_n = \sum_{m=0}^{M-1} B_m(\vec{b_m}, x_{n-m})$$

wherein "n" is a time index, wherein $x_n$ is a current sample of said predistorted signal, wherein $y_n$ is said current sample of said output signal, wherein $B_m(\cdot)$ is a polynomial representation of said amplifier, wherein $\vec{b}_m$ is a vector of said complex polynomial coefficients, and wherein M is an order of amplifier memory equal to the number of said plurality of delay taps.

14. The method according to claim 13, wherein said complex polynomial includes both even and odd terms.

15. The method according to claim 14, wherein said coefficients generating step employs a minimum mean squared error criteria to determine said polynomial coefficients.

16. An apparatus for estimating the characteristics of a power amplifier, said apparatus comprising:

a polynomial module responsive to a plurality of time-spaced samples of a predistorted signal by generating a complex polynomial representative for each of said plurality of time-spaced samples;

said polynomial module responsive to a current sample of an output from said amplifier by generating an update for coefficients of said complex polynomial representative of said amplifier.

17. The apparatus according to claim 16, wherein said polynomial module uses a current sample of said predistorted signal and at least one previous sample of said predistorted signal for characterizing said amplifier.

18. The apparatus according to claim 17, wherein said amplifier is characterized as a summation of said complex polynomial representatives.

* * * * *